United States Patent
Zhao et al.

(10) Patent No.: US 10,262,618 B2
(45) Date of Patent: *Apr. 16, 2019

(54) GATE DRIVER ON ARRAY CIRCUIT AND LIQUID CRYSTAL DISPLAY USING THE SAME

(71) Applicant: WUHAN CHINA STAR OPTOELECTRONICS TECHNOLOGY CO., LTD., Wuhan (CN)

(72) Inventors: Mang Zhao, Wuhan (CN); Gui Chen, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/021,461

(22) PCT Filed: Feb. 26, 2016

(86) PCT No.: PCT/CN2016/074677
§ 371 (c)(1),
(2) Date: Mar. 11, 2016

(87) PCT Pub. No.: WO2017/117855
PCT Pub. Date: Jul. 13, 2017

(65) Prior Publication Data
US 2018/0301107 A1    Oct. 18, 2018

(30) Foreign Application Priority Data

Jan. 7, 2016 (CN) .......................... 2016 1 0007794

(51) Int. Cl.
| G09G 3/36 | (2006.01) |
| G02F 1/13 | (2006.01) |
| H03K 17/687 | (2006.01) |

(52) U.S. Cl.
CPC ............. *G09G 3/3696* (2013.01); *G02F 1/13* (2013.01); *G09G 3/36* (2013.01); *G09G 3/3677* (2013.01);
(Continued)

(58) Field of Classification Search
CPC ...... G02F 1/136286; G09G 2300/0408; G09G 2310/0283; G09G 2310/0286;
(Continued)

(56) References Cited

U.S. PATENT DOCUMENTS

| 8,558,586 B1* | 10/2013 | Martin | ................. G11C 7/1057 327/108 |
| 2006/0007085 A1* | 1/2006 | Kim | ..................... G09G 3/3677 345/87 |

(Continued)

*Primary Examiner* — Viet D Pham
(74) *Attorney, Agent, or Firm* — Mark M. Friedman

(57) ABSTRACT

A GOA circuit includes GOA circuit units. Each GOA circuit has a holding module A first transistor and a second transistor in the holding module holds the voltage imposed on the first control node to be at high voltage level. Also, the transistors form a direct current passage between the first control node and a first fixed voltage at high voltage level so the voltage imposed on the first control node is not lowered due to electricity leakage. The GOA circuit unit can resolve the problem of easy leakage of electricity. When the scanning signals are output by the GOA circuit unit, the stability is highly ensured.

18 Claims, 3 Drawing Sheets

(52) U.S. Cl.
CPC . *H03K 17/6871* (2013.01); *G09G 2300/0866* (2013.01); *G09G 2310/0289* (2013.01); *G09G 2320/0214* (2013.01)

(58) Field of Classification Search
CPC .. G09G 3/3648; G09G 3/3674; G09G 3/3677; G09G 3/3696; G11C 19/28; H01L 27/124; H01L 27/1255
See application file for complete search history.

(56) References Cited

U.S. PATENT DOCUMENTS

| | | | |
|---|---|---|---|
| 2014/0093028 A1* | 4/2014 | Wu | G11C 19/28 377/64 |
| 2014/0169518 A1* | 6/2014 | Kong | G09G 3/3674 377/64 |
| 2014/0192039 A1* | 7/2014 | Wang | G11C 19/28 345/213 |
| 2015/0228240 A1* | 8/2015 | Ahn | H03K 17/284 345/213 |
| 2016/0268004 A1* | 9/2016 | Li | G11C 19/28 |
| 2016/0372063 A1* | 12/2016 | Li | G11C 19/28 |
| 2017/0186393 A1* | 6/2017 | Wang | G09G 3/36 |
| 2017/0236482 A1* | 8/2017 | Ochiai | G11C 19/28 345/212 |

* cited by examiner

GATE DRIVER ON ARRAY CIRCUIT AND LIQUID CRYSTAL DISPLAY USING THE SAME

BACKGROUND OF THE INVENTION

1. Field of the Invention

The present invention relates to a liquid crystal display (LCD), and more particularly, to an LCD using a gate driver on array (GOA) circuit.

2. Description of the Prior Art

The technique to a GOA circuit is that a gate driver is fabricated on a substrate comprising a thin film transistor (TFT) array using the TFT-LCD array process for realizing the driving method of row-by-row scanning.

The GOA circuit comprises a plurality of GOA circuit units. A conventional GOA circuit unit is used for outputting a scanning signal by controlling the output of a gate voltage of the transistor (i.e., a Q node voltage). To ensure that the output transistor exactly conducts a signal pulse at high voltage level to a source from a drain for forming a pulse of a scanning signal, the conventional technique is that the output transistor is pre-charged so that the Q node voltage is charged to a high voltage level before the output transistor conducts the signal at high voltage level. To keep the Q node voltage at high voltage level for at least two clock pulses, a capacitor which stores the Q node voltage is adopted in the conventional technology. The capacitor is still electrically connected to other transistors in the GOA circuit unit at this time, so the charge stored in the capacitor tends to leak from other transistors. At last, leakage of electricity occurs. As a result, the Q node voltage is lowered, which causes the output transistor to fail to be turned on completely. Further, the output transistor fails to conduct the signal at high voltage level completely, and then an incomplete scanning signal pulse is formed.

Therefore, it is necessary to improve the conventional method of depositing the voltage at the Q node to the capacitor to prevent the leakage of electricity at the Q node.

SUMMARY OF THE INVENTION

In light of the problem mentioned above, an object of the present invention is to propose a GOA circuit and an LCD adopting the GOA circuit for resolving the problem happening in the conventional technology.

According to the present invention, a gate driver on array (GOA) circuit comprises a plurality of cascade-connected GOA circuit units. Each stage GOA circuit unit outputs a scanning signal from an output terminal according to a scanning signal, a first clock signal, and a second clock signal output by a previous two stage GOA circuit unit. Each stage GOA circuit unit comprises an input control module, a holding module, an output control module, a voltage regulating module, a pull-up module, and a pull-down holding module. The input control module is used for conducting when the scanning signal output by the a previous two stage GOA circuit unit is received. The holding module electrically connected to the input control module and a first control node, is used for holding a voltage level of the first control node. The holding module comprises a first transistor and a second transistor. The first transistor comprises a first control terminal electrically connected to the input control module, a first input terminal electrically connected to a first fixed voltage, and a first output terminal electrically connected to the first control node. The second transistor comprises a second control terminal and a second output terminal electrically connected to the first control node, and a second input terminal electrically connected to the input control module. The output control module electrically connected to the first control node, is used for controlling the output scanning signal based on voltage imposed on the first control node. The voltage regulating module electrically connected to the holding module, is used for preventing electricity leakage. The pull-up module electrically connected to the second control node, is used for holding the second control node at high voltage level when the second clock signal is received. The pull-down holding module electrically connected to the input control module, the holding module, the output control module, the pull-up module, and the voltage regulating module, is used for holding the second control node at low voltage level during a non-scan time period and for holding the scanning signal at low voltage level.

In one aspect of the present invention, the voltage regulating module comprises a third transistor. The third transistor comprises a third control electrode electrically connected to the first fixed voltage, a third input electrode electrically connected to the first control electrode of the first transistor, and a third output electrode electrically connected to the second control node.

In another aspect of the present invention, the pull-up module comprises a fourth transistor. The fourth transistor comprises a fourth control electrode electrically connected to the second clock signal, a fourth input electrode electrically connected to the first fixed voltage, and a fourth output electrode electrically connected to the second control node.

In another aspect of the present invention, the pull-down holding module comprises a fifth transistor, a sixth transistor, a seventh transistor, an eighth transistor, and a capacitor. The fifth transistor comprises a fifth control electrode electrically connected to the second clock signal, a fifth input electrode electrically connected to the third output electrode of the third transistor, and a fifth output electrode electrically connected to the second control node. The sixth transistor comprises a sixth control electrode electrically connected to the third output electrode of the third transistor, a sixth input electrode electrically connected to the second control node, and a sixth output electrode electrically connected to the second fixed voltage. The seventh transistor comprises a seventh control electrode electrically connected to the second control node, a seventh input electrode electrically connected to the first control node, and a seventh output electrode electrically connected to the second fixed voltage. The eighth transistor comprises an eighth control electrode electrically connected to the second control node, an eighth input electrode electrically connected to the output terminal, and an eighth output electrode electrically connected to the second fixed voltage. The capacitor comprises two terminals electrically connected to the second control node and the second fixed voltage.

In another aspect of the present invention, each of the transistors is an N-type metal oxide semiconductor (NMOS) transistor, the first fixed voltage is at high voltage level, and the second fixed voltage is at low voltage level.

In another aspect of the present invention, each of the transistors is a P-type metal oxide semiconductor (PMOS) transistor. The first fixed voltage is at low voltage level, and the second fixed voltage is at high voltage level.

In another aspect of the present invention, the input control module comprises a ninth transistor. The ninth transistor comprises a ninth control electrode and a ninth input electrode electrically connected to the scanning signal output by the a previous two stage GOA circuit unit and a ninth output electrode electrically connected to the first control electrode of the first transistor.

In still another aspect of the present invention, the output control module comprises a tenth transistor. The tenth transistor comprises a tenth control electrode electrically connected to the first control node, a tenth input electrode electrically connected to the first clock signal, and a tenth output electrode electrically connected to the output terminal.

In yet another aspect of the present invention, a pulse of the first clock signal and a pulse of the second clock signal never overlap with each other.

According to the present invention, a liquid crystal display comprises a source driver for outputting data signal to a plurality of pixel units to display grey levels, and a GOA circuit as disclosed above.

Compared with the conventional technology, a holding module is substituted for a capacitor in a GOA circuit unit proposed by the present invention. A first transistor and a second transistor in the holding module holds the voltage imposed on the first control node to be at high voltage level. Also, the transistors form a direct current passage between the first control node and a first fixed voltage at high voltage level so the voltage imposed on the first control node is not lowered due to electricity leakage. In conclusion, the GOA circuit unit proposed by the present invention can resolve the problem of easy leakage of electricity, which frequently happens in the conventional GOA circuit unit comprising the capacitor. When the scanning signals are output by the GOA circuit unit proposed by the present invention, the stability is highly ensured.

These and other features, aspects and advantages of the present disclosure will become understood with reference to the following description, appended claims and accompanying figures.

DETAILED DESCRIPTION OF THE PREFERRED EMBODIMENTS

Figure 1:
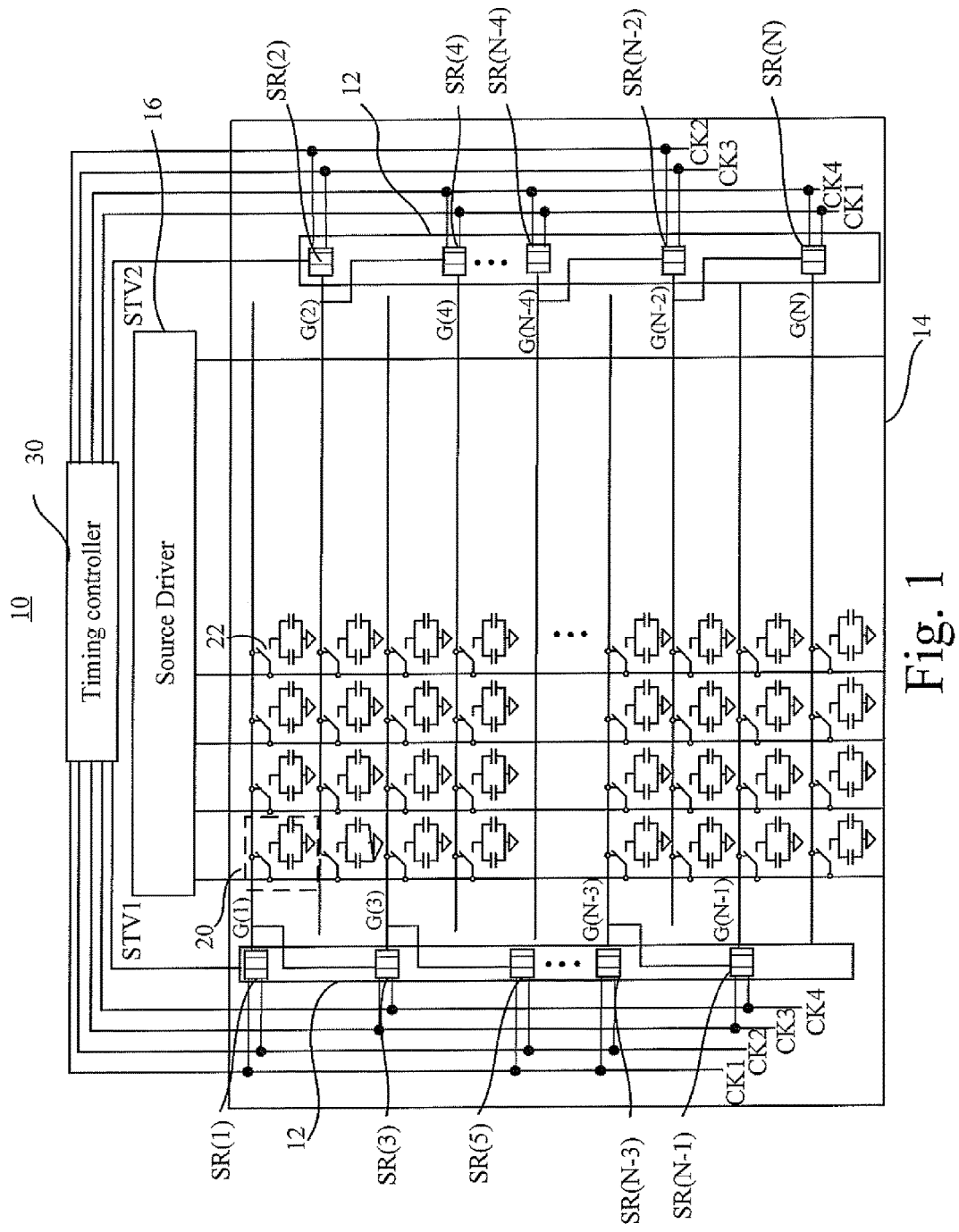
FIG. 1 is a functional block diagram of an LCD according a preferred embodiment of the present invention.

Please refer to FIG. 1. FIG. 1 is a functional block diagram of an LCD 10 according a preferred embodiment of the present invention. The LCD 10 comprises a glass substrate 14, a timing controller 30, and a source driver 16. A plurality of pixels arranged in a matrix and a plurality of GOA circuits 12 arranged in matrices are disposed on the glass substrate 14. Each of the plurality of pixels comprises three pixel units 20, which represent three primary colors, that is, red (R), green (G), and blue (B). The timing controller 30 is used for generating clock signals CK1-CK4 and commencing signals STV1 and STV2. Each of the plurality of GOA circuits 12 outputs a scanning signal at regular intervals for turning on transistors 22 on each row successively. Meanwhile, the source driver 16 outputs a corresponding data signal to all of the pixel units 20 on one column so that all of the pixel units 20 on the column can be fully charged for showing diverse grayscales. When all of the pixel units 20 on the same row are fully charged, the scanning signal for the row is turned off by the GOA circuit 12. Then, the GOA circuit 12 outputs a scanning signal to turn on the transistors 22 on the next row. The source driver 16 charges and discharges the transistors 22 on the next row. According to the step, all of the pixel units 20 are fully charged in the end. Subsequently, the pixel units 20 on the first row are charged again. Take the LCD 10 with resolution of 1024×768 and a refresh frequency of 60 Hz for example. 1024×768×3 pixel units 20 are required. The show time of each image is about 1/60=16.67 ms. The GOA circuit 12 as shown in FIG. 1 comprises N GOA circuit units SR(1), ..., SR(N) where N indicates 768.

Figure 2:
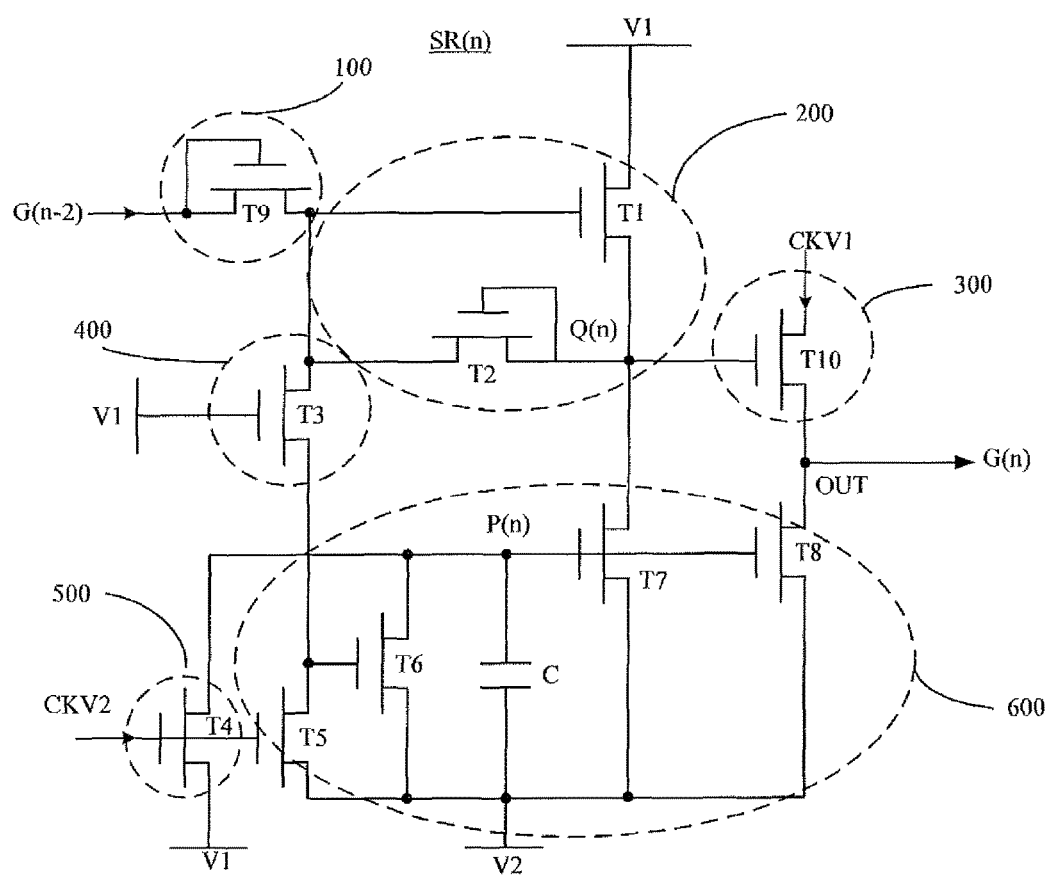
FIG. 2 is a circuit diagram of a GOA circuit unit according to a first embodiment of the present invention.

Please refer to FIG. 1 and FIG. 2. FIG. 2 is a circuit diagram of a GOA circuit unit SR(n) according to a first embodiment of the present invention. To narrow down the non-display sections at both sides (i.e., the sections of the glass substrate 14 where the GOA circuits 12 are arranged), the GOA circuits 12 are arranged on two sides of the glass substrate 14. The GOA circuit 12 comprises a plurality of cascade-connected GOA circuit units SR(n) where n ranges from zero to N. Preferably, two GOA circuits 12 comprises GOA circuit units SR(1), SR(3), ..., SR (767) generating odd scanning signals G(1), G(3), ..., G(767) and GOA circuit units SR(2), SR(4), ..., SR (768) generating even scanning signals G(2), G(4), ..., G(768), respectively. When receiving the commencing signal STV1, the GOA circuit unit SR(1) generates a scanning signal G(1) according to the clock signals CK1 and CK2. When receiving the commencing signal STV2, the GOA circuit unit SR(2) generates a scanning signal G(2) according to the clock signals CK2 and CK3. In the following, each stage GOA circuit unit SR(n) outputs a scanning signal G(n) from the output terminal OUT according to a scanning signal G(n−2), a first clock signal CKV1, and a second clock signal CKV2 output by a previous two stage GOA circuit unit SR(n−2). The clock signal CKV1 and the second clock signal CKV2 represent two of the four clock signals CK1-CK4, respectively. The clock signals CK1-CK4 produce pulses alternatively, and the produced pulses never overlap temporally. Specifically, the GOA circuit units SR(1), SR(5), ..., SR (N−3) generate the scanning signals G(1), G(5), ..., G(N−3) according to the clock signals CK1 and CK2 (i.e., the first clock signal CKV1 and the second clock signal CKV2 as shown in FIG. 2). Also, the GOA circuit units SR(2), SR(6), ..., SR (N−2) generate the scanning signals G(2), G(6), ..., G(N−2) according to the clock signals CK2 and CK3 (i.e., the first clock signal CKV1 and the second clock signal CKV2 as shown in FIG. 2). Also, the GOA circuit units SR(3), SR(7), ..., SR (N−1) generate the scanning signals G(3), G(7), ..., G(N−1) according to the clock signals CK3 and CK4 (i.e., the first clock signal CKV1 and the second clock signal CKV2 as shown in FIG. 2). Also, the GOA circuit units SR(4), SR(8), ..., SR (N) generate the scanning signals G(4), G(8), ..., G(N) according to the clock signals CK4 and CK1 (i.e., the first clock signal CKV1 and the second clock signal CKV2 as shown in FIG. 2).

Each stage GOA circuit unit SR(n) comprises an input control module 100, a holding module 200, an output control module 300, a voltage regulating module 400, a pull-up module 500, and a pull-down holding module 600. The input control module 100 is used for conducting when receiving the scanning signal G(n−2) output by the a previous two stage GOA circuit unit SR(n−2). The holding module 200 is electrically connected to the input control module 100 and a first control node Q(n) and used for holding the voltage level of the first control node Q(n). The output control module 300 is electrically connected to the first control node Q(n) and used for controlling the output scanning signal G(n) based on the voltage imposed on the first control node Q(n). The voltage regulating module 400 is electrically connected to the holding module 200 and used for preventing electricity leakage. The pull-up module 500 is electrically connected to the second control node P(n) and used for holding the second control node P(n) at high voltage level when receiving the second clock signal CKV2. The pull-down holding module 600 is electrically connected to the input control module 100, the holding module 200, the output control module 300, the pull-up module 500, and the voltage regulating module 400 and used for holding the second control node P(n) at low voltage level during a non-scan time period and holding the output scanning signal G(n) at low voltage level.

The holding module 200 comprises a first transistor T1 and a second transistor T2. The first transistor T1 comprises a first control terminal electrically connected to the input control module 100, a first input terminal electrically connected to a first fixed voltage V1, and a first output terminal electrically connected to the first control node Q(n). The second transistor T2 comprises a second control terminal and a second output terminal electrically connected to the first control node Q(n) and a second input terminal electrically connected to the input control module 100.

The voltage regulating module 400 comprises a third transistor T3. The third transistor T3 comprises a third control electrode electrically connected to the first fixed voltage V1, a third input electrode electrically connected to a first control electrode of the first transistor T1, and a third output electrode electrically connected to the second control node P(n).

The pull-up module 500 comprises a fourth transistor T4. The fourth transistor T4 comprises a fourth control electrode electrically connected to the second clock signal CKV2, a fourth input electrode electrically connected to the first fixed voltage V1, and a fourth output electrode electrically connected to the second control node P(n).

The pull-down holding module 600 comprises a fifth transistor T5, a sixth transistor T6, a seventh transistor T7, an eighth transistor T8, and a capacitor C. The fifth transistor T5 comprises a fifth control electrode electrically connected to the second clock signal CKV2, a fifth input electrode electrically connected to the third output electrode of the third transistor T3, and a fifth output electrode electrically connected to the second fixed voltage V2. The sixth transistor T6 comprises a sixth control electrode electrically connected to the third output electrode of the third transistor T3, a sixth input electrode electrically connected to the second control node P(n), and a sixth output electrode electrically connected to the second fixed voltage V2. The seventh transistor T7 comprises a seventh control electrode electrically connected to the second control node P(n), a seventh input electrode electrically connected to the first control node Q(n), and a seventh output electrode electrically connected to the second fixed voltage V2. The eighth transistor T8 comprises an eighth control electrode electrically connected to the second control node P(n), an eighth input electrode electrically connected to the output terminal OUT, and an eighth output electrode electrically connected to the second fixed voltage V2. The capacitor C comprises two terminals electrically connected to the second control node P(n) and the second fixed voltage V2.

The input control module 100 comprises a ninth transistor T9. The ninth transistor T9 comprises a ninth control electrode and a ninth input electrode electrically connected to the scanning signal G(n−2) output by the a previous two stage GOA circuit unit SR(n−2) and a ninth output electrode electrically connected to the first control electrode of the first transistor T1.

The output control module 300 comprises a tenth transistor T10. The tenth transistor T10 comprises a tenth control electrode electrically connected to the first control node Q(n), a tenth input electrode electrically connected to the first clock signal CKV1, and a tenth output electrode electrically connected to the output terminal OUT.

All of the transistors in the GOA circuit unit SR(n) as shown in FIG. 2 are N-type metal oxide semiconductor (NMOS) transistors. Preferably, the control electrode, the input electrode, and the output electrode of each of the transistors T1-T10 are the gate, the drain, and the source of each of the transistors T1-T10, respectively. The first fixed voltage V1 is at high voltage level. The second fixed voltage V2 is at low voltage level. The input electrode and the output electrode of each of the transistors T1-T10 can also be the source and the drain of the transistor, respectively.

Figure 3:
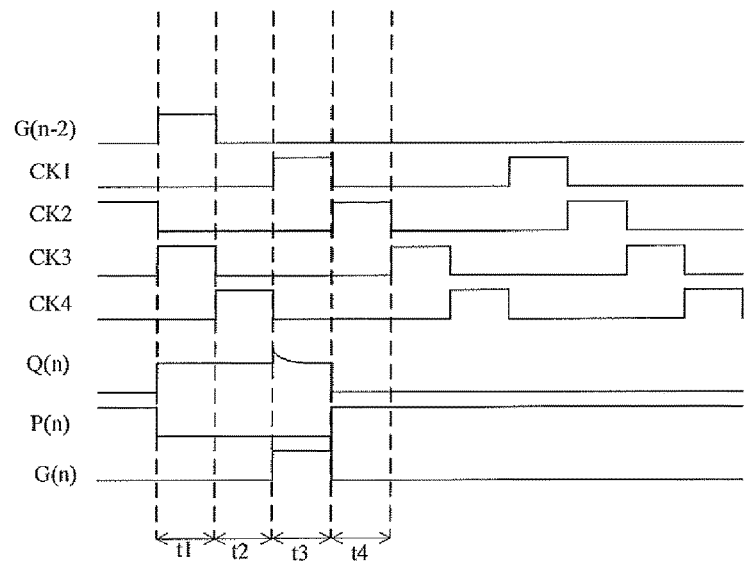
FIG. 3 is a timing diagram of various input signals, output signals, and node voltages as shown in FIG. 2.

Please refer to FIG. 3 as well. FIG. 3 is a timing diagram of various input signals, output signals, and node voltages as shown in FIG. 2. The time periods when each of the GOA circuit units SR(n) receives the scanning signal G(n−2) and then outputs the scanning signal G(n) are called scan time periods, that is, t1-t3 shown in FIG. 3. The remaining time periods are called non-scan time periods. Each of the scan time periods is divided into a pre-charge time period (t1-t2) and a pulse output time period (t3). For better explanation, this embodiment details the GOA circuit unit SR(n) using the clock signals CK1 and CK2 (the first clock signal CKV1 and the second clock signal CKV2, respectively).

During the time period of t1, the ninth control electrode of the ninth transistor T9 receives the scanning signal G(n−2) at high voltage level. The scanning signal G(n−2) is transmitted to the first control electrode of the first transistor T1 by the ninth transistor T9 for turning on the first transistor T1. So the first transistor T1 is turned on, and the fixed voltage V1 at high voltage level is output to the first control node Q(n). Meanwhile, the fifth control electrode of the fifth transistor T5 receives the first fixed voltage V1 at high voltage level, and the scanning signal G(n−2) at high voltage level is transmitted to the eighth control electrode of the eighth transistor T8. So the eighth transistor T8 is turned on, and the first fixed voltage V2 at low voltage level is output to the second control node P(n). Meanwhile, the fourth transistor T4 is turned on, and the first clock signal CKV1 at low voltage level is transmitted to the output terminal OUT, so the scanning signal G(n) is at low voltage level.

During the time period of t2, the first transistor T1 and the eighth transistor T8 are not turned on. The first transistor T1 and the second transistor T2 in the holding module 200 hold the voltage imposed on the first control node Q(n) at high voltage level. Because the first transistor T1 forms a direct current passage between the first control node Q(n) and the first fixed voltage V1 at high voltage level, the voltage imposed on the first control node Q(n) is prevented from lowered due to electricity leakage. In the meantime, the fourth transistor T4 is conducted, and the first clock CKV1 at low voltage level is transmitted to the output terminal OUT. So the scanning signal G(n) is at low voltage level.

While the fourth control electrode of the fourth transistor T4 receives the held first control node Q(n) at high voltage level during the time period of t3, the first clock signal CKV1 at high voltage level is transmitted to the output terminal OUT for forming the pulse of the scanning signal G(n).

During the time period of t4, the fourth transistor T4 and the fifth transistor T5 are turned on because of the second clock signal CKV2 at high voltage level. The first fixed voltage V1 at high voltage level is transmitted to the second control node P(n). The seventh control electrode of the seventh transistor T7 and the eighth control electrode of the eighth transistor T8 are turned on because of the second control node P(n) at high voltage level. So the first control node Q(n) and the output terminal OUT are pulled down to be at stably low voltage level. In the meantime, the scanning signal G(n) is at low voltage level.

Figure 4:
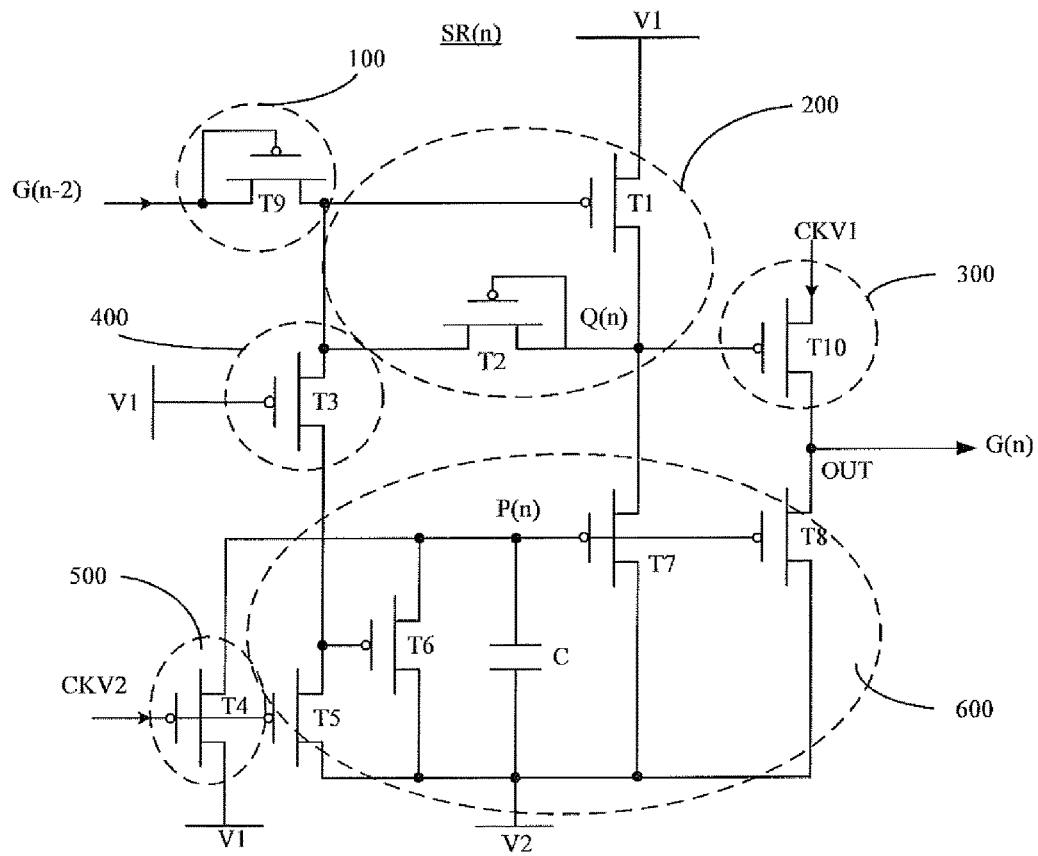
FIG. 4 is a circuit diagram of a GOA circuit unit according to a second embodiment of the present invention.

Please refer to FIG. 4. FIG. 4 is a circuit diagram of a GOA circuit unit SR(n) according to a second embodiment of the present invention. Differing from FIG. 2, all of the transistors in the GOA circuit unit SR(n) as shown in FIG. 4 are P-type metal oxide semiconductor (PMOS) transistors. The first fixed voltage V1 is at low voltage level. The second fixed voltage V2 is at high voltage level. The connection and operation of components as shown in FIG. 2 is the same as that as shown in FIG. 4. This embodiment does not go into detail. Besides, it is understood by the people skilled in this field that the PMOS transistors can be substituted for some or all of the NMOS transistors based on the circuit proposed by the present invention for realizing the GOA circuit units with the same functions.

Compared with the conventional technology, a holding module 200 is substituted for a capacitor in a conventional GOA circuit unit proposed by the present invention. A first transistor T1 and a second transistor T2 in the holding module 200 holds the voltage imposed on the first control node Q(n) to be at high voltage level. Also, the transistor T1 form a direct current passage between the first control node Q(n) and a first fixed voltage V1 at high voltage level so the voltage imposed on the first control node Q(n) is not lowered due to electricity leakage. In conclusion, the GOA circuit unit proposed by the present invention can resolve the problem of easy leakage of electricity, which frequently happens in the conventional GOA circuit unit comprising the capacitor. When the scanning signals are output by the GOA circuit unit proposed by the present invention, the stability is highly ensured.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A gate driver on array (GOA) circuit, comprising:
   a plurality of cascade-connected GOA circuit units, each stage GOA circuit unit outputting a scanning signal from an output terminal according to a scanning signal, a first clock signal, and a second clock signal output by a previous two stage GOA circuit unit, and each stage GOA circuit unit comprising:
   an input control module, for conducting when the scanning signal output by the previous two stage GOA circuit unit is received;
   a holding module, electrically connected to the input control module and a first control node, for holding a voltage level of the first control node, comprising:
      a first transistor, comprising a first control terminal electrically connected to the input control module, a first input terminal electrically connected to a first fixed voltage, and a first output terminal electrically connected to the first control node; and
      a second transistor, comprising a second control terminal and a second output terminal electrically connected to the first control node, and a second input terminal electrically connected to the input control module;
   an output control module, electrically connected to the first control node, for controlling the output scanning signal based on voltage imposed on the first control node;
   a voltage regulating module, electrically connected to the holding module, for preventing electricity leakage;
   a pull-up module, electrically connected to a second control node, for holding the second control node at high voltage level when the second clock signal is received; and
   a pull-down holding module, electrically connected to the holding module, the output control module, the pull-up module, and the voltage regulating module, for holding the second control node at low voltage level during a non-scan time period and for holding the scanning signal at low voltage level.

2. The GOA circuit of claim 1, wherein the voltage regulating module comprises a third transistor, and the third transistor comprises a third control electrode electrically connected to the first fixed voltage, a third input electrode electrically connected to the first control electrode of the first transistor, and a third output electrode electrically connected to the second control node.

3. The GOA circuit of claim 2, wherein the pull-up module comprises a fourth transistor, and the fourth transistor comprises a fourth control electrode electrically connected to the second clock signal, a fourth input electrode electrically connected to the first fixed voltage, and a fourth output electrode electrically connected to the second control node.

4. The GOA circuit of claim 3, wherein the pull-down holding module comprises:
   a fifth transistor, comprising a fifth control electrode electrically connected to the second clock signal, a fifth input electrode electrically connected to the third output electrode of the third transistor, and a fifth output electrode electrically connected to the second control node;
   a sixth transistor, comprising a sixth control electrode electrically connected to the third output electrode of the third transistor, a sixth input electrode electrically connected to the second control node, and a sixth output electrode electrically connected to the second fixed voltage;
   a seventh transistor, comprising a seventh control electrode electrically connected to the second control node, a seventh input electrode electrically connected to the first control node, and a seventh output electrode electrically connected to the second fixed voltage;
   an eighth transistor, comprising an eighth control electrode electrically connected to the second control node, an eighth input electrode electrically connected to the output terminal, and an eighth output electrode electrically connected to the second fixed voltage; and
   a capacitor, comprising two terminals electrically connected to the second control node and the second fixed voltage.

5. The GOA circuit of claim 4, wherein each of the transistors is an N-type metal oxide semiconductor (NMOS)

transistor, the first fixed voltage is at high voltage level, and the second fixed voltage is at low voltage level.

6. The GOA circuit of claim 4, wherein each of the transistors is a P-type metal oxide semiconductor (PMOS) transistor, the first fixed voltage is at low voltage level, and the second fixed voltage is at high voltage level.

7. The GOA circuit of claim 1, wherein the input control module comprises a ninth transistor, and the ninth transistor comprises a ninth control electrode and a ninth input electrode electrically connected to the scanning signal output by the previous two stage GOA circuit unit and a ninth output electrode electrically connected to the first control electrode of the first transistor.

8. The GOA circuit of claim 1, wherein the output control module comprises a tenth transistor, and the tenth transistor comprises a tenth control electrode electrically connected to the first control node, a tenth input electrode electrically connected to the first clock signal, and a tenth output electrode electrically connected to the output terminal.

9. The GOA circuit of claim 1, wherein a pulse of the first clock signal and a pulse of the second clock signal never overlap with each other.

10. A liquid crystal display comprising:
a source driver, for outputting data signal to a plurality of pixel units to display grey levels; and
a gate driver on array (GOA) circuit, comprising:
  a plurality of cascade-connected GOA circuit units, each stage GOA circuit unit outputting a scanning signal from an output terminal according to a scanning signal, a first clock signal, and a second clock signal output by a previous two stage GOA circuit unit, and each stage GOA circuit unit comprising:
  an input control module, for conducting when the scanning signal output by the previous two stage GOA circuit unit is received;
  a holding module, electrically connected to the input control module and a first control node, for holding a voltage level of the first control node, comprising:
    a first transistor, comprising a first control terminal electrically connected to the input control module, a first input terminal electrically connected to a first fixed voltage, and a first output terminal electrically connected to the first control node; and
    a second transistor, comprising a second control terminal and a second output terminal electrically connected to the first control node, and a second input terminal electrically connected to the input control module;
  an output control module, electrically connected to the first control node, for controlling the output scanning signal based on voltage imposed on the first control node;
  a voltage regulating module, electrically connected to the holding module, for preventing electricity leakage;
  a pull-up module, electrically connected to a second control node, for holding the second control node at high voltage level when the second clock signal is received; and
  a pull-down holding module, electrically connected to the holding module, the output control module, the pull-up module, and the voltage regulating module, for holding the second control node at low voltage level during a non-scan time period and for holding the scanning signal at low voltage level.

11. The liquid crystal display of claim 10, wherein the voltage regulating module comprises a third transistor, and the third transistor comprises a third control electrode electrically connected to the first fixed voltage, a third input electrode electrically connected to the first control electrode of the first transistor, and a third output electrode electrically connected to the second control node.

12. The liquid crystal display of claim 11, wherein the pull-up module comprises a fourth transistor, and the fourth transistor comprises a fourth control electrode electrically connected to the second clock signal, a fourth input electrode electrically connected to the first fixed voltage, and a fourth output electrode electrically connected to the second control node.

13. The liquid crystal display of claim 12, wherein the pull-down holding module comprises:
  a fifth transistor, comprising a fifth control electrode electrically connected to the second clock signal, a fifth input electrode electrically connected to the third output electrode of the third transistor, and a fifth output electrode electrically connected to the second control node;
  a sixth transistor, comprising a sixth control electrode electrically connected to the third output electrode of the third transistor, a sixth input electrode electrically connected to the second control node, and a sixth output electrode electrically connected to the second fixed voltage;
  a seventh transistor, comprising a seventh control electrode electrically connected to the second control node, a seventh input electrode electrically connected to the first control node, and a seventh output electrode electrically connected to the second fixed voltage;
  an eighth transistor, comprising an eighth control electrode electrically connected to the second control node, an eighth input electrode electrically connected to the output terminal, and an eighth output electrode electrically connected to the second fixed voltage; and
  a capacitor, comprising two terminals electrically connected to the second control node and the second fixed voltage.

14. The liquid crystal display of claim 13, wherein each of the transistors is an N-type metal oxide semiconductor (NMOS) transistor, the first fixed voltage is at high voltage level, and the second fixed voltage is at low voltage level.

15. The liquid crystal display of claim 13, wherein each of the transistors is a P-type metal oxide semiconductor (PMOS) transistor, the first fixed voltage is at low voltage level, and the second fixed voltage is at high voltage level.

16. The liquid crystal display of claim 10, wherein the input control module comprises a ninth transistor, and the ninth transistor comprises a ninth control electrode and a ninth input electrode electrically connected to the scanning signal output by the previous two stage GOA circuit unit and a ninth output electrode electrically connected to the first control electrode of the first transistor.

17. The liquid crystal display of claim 10, wherein the output control module comprises a tenth transistor, and the tenth transistor comprises a tenth control electrode electrically connected to the first control node, a tenth input electrode electrically connected to the first clock signal, and a tenth output electrode electrically connected to the output terminal.

18. The liquid crystal display of claim 10, wherein a pulse of the first clock signal and a pulse of the second clock signal never overlap with each other.

* * * * *